(12) United States Patent
Tamarkin et al.

(10) Patent No.: US 7,907,414 B1
(45) Date of Patent: Mar. 15, 2011

(54) NETWORK DEVICE HAVING LEVERS AND ASSOCIATED METHODS

(75) Inventors: Vladimir Tamarkin, Huntingdon Valley, PA (US); Mark W. Wessel, Aston, PA (US); William F. Federer, Jr., West Chester, PA (US)

(73) Assignee: QLOGIC, Corporation, Aliso Viejo, CA (US)

( * ) Notice: Subject to any disclaimer, the term of this patent is extended or adjusted under 35 U.S.C. 154(b) by 212 days.

(21) Appl. No.: 12/410,294

(22) Filed: Mar. 24, 2009

Related U.S. Application Data

(60) Provisional application No. 61/114,395, filed on Nov. 13, 2008.

(51) Int. Cl.
*H05K 7/00* (2006.01)
(52) U.S. Cl. .......... 361/747; 361/801; 361/802; 361/752
(58) Field of Classification Search .................. 361/737, 361/741, 747, 756, 800–802, 600, 679.01, 361/724–726, 728–730, 754–755, 759, 784, 361/796, 798; 439/152, 153, 157, 159, 160, 439/296, 372
See application file for complete search history.

(56) References Cited

U.S. PATENT DOCUMENTS

| | | | | |
|---|---|---|---|---|
| 5,222,897 A | * | 6/1993 | Collins et al. | 439/157 |
| 5,791,753 A | * | 8/1998 | Paquin | 312/332.1 |
| 7,298,624 B2 | * | 11/2007 | Boswell et al. | 361/727 |
| 7,804,690 B2 | * | 9/2010 | Huang et al. | 361/724 |
| 7,835,154 B2 | * | 11/2010 | Kunkle et al. | 361/728 |

* cited by examiner

*Primary Examiner* — Hung S Bui
(74) *Attorney, Agent, or Firm* — Klein, O'Neill & Singh, LLP

(57) ABSTRACT

A network device including a module. A chassis supports the module. A lever is secured to an enclosure of the module by a pivot. In one embodiment a pivot axis of the lever is parallel to a major axis of the module. In another embodiment the enclosure includes a clearance through which a portion of a lever from an adjacent module may pass. In another embodiment the lever includes a handle portion and a claw portion. A portion of the handle defines a first plane, the claw defines a second plane, and the first and second planes are parallel and spaced from one another. In another embodiment at least part of the claw portion protrudes outward from an envelope of the module enclosure.

15 Claims, 4 Drawing Sheets

NETWORK DEVICE HAVING LEVERS AND ASSOCIATED METHODS

CROSS-REFERENCE TO RELATED APPLICATIONS

This application claims priority to provisional application Ser. No. 61/114,395, filed on Nov. 13, 2008, the entire contents of which are hereby incorporated by reference.

BACKGROUND

The present invention relates to network devices and apparatus and methods for engaging/disengaging modules with the devices.

DESCRIPTION OF RELATED ART

Modular, scalable network devices often include pluggable circuit card modules. Examples of such network devices are server blade systems or network switch systems where multiple processor/memory modules (blades) or network switching modules plug into a common infrastructure to form a scalable, modular system.

Pluggable modules often implement mechanical levers and latches to assist in engaging and disengaging modules with the system. These levers provide a mechanical advantage that helps to overcome frictional resistance from connectors engaging/disengaging one another. While mechanical advantage is a common feature of all such levers, overall lever design can differ greatly between different systems. Modules with high density of input/output (I/O) connectors often include thin levers oriented to be parallel with the length (or major axis) of the module. Such lever design helps to reduce interference between levers and I/O connectors. It also helps to increase module bezel area available for I/O connectors.

FIG. 1 illustrates a network device 10 having three modules 12 supported by a chassis 14. Each module 12 has high density of I/O connectors 16, and each includes levers 18. The levers 18 represent the typical lever orientation in which a length of the lever 18 is parallel to the major axis $A_M$ of the corresponding module 12. For clarity, only one major axis $A_M$ is shown in FIG. 1. However, those of ordinary skill in the art will appreciate that each module 12 includes its own major axis. In FIG. 1, all major axes are parallel. The lever orientation of FIG. 1 results in a pivot axis $A_P$ of each lever 18 being orthogonal to the major axis $A_M$ of the corresponding module 12.

Common elements of a lever 18, as shown in the lower left of FIG. 1, are a pivot (or fulcrum) 22, a claw 24 and a handle 26. The pivot 22 secures the lever 18 to the module 12 enclosure 20. When an operator applies a force to the handle 26, the lever 18 rotates around the pivot 22 and the claw 24 engages the chassis 14. The applied force, and reaction forces at the claw 24 and pivot 22, create a three-point bending load on the lever 18. The applied force and the claw reaction force act on the lever 18 in a first direction, and the pivot reaction force acts on the lever 18 in the opposite direction. A reaction force created by the lever 18 acting on the pivot 22 forces the module 12 into or out of the chassis 14 (into or out of the plane of the paper in FIG. 1) as the operator continues applying force to the handle 26.

One common feature of levers used in network devices, including the levers 18 of FIG. 1, is that these levers 18 are contained completely within the space allocated for the module within the chassis. This allocated space is known as a card slot, as indicated in FIG. 1. Containing the levers 18 within the space envelope of the card slot prevents the levers 18 of a first module 12 from interfering with any portion of a second module 12.

While the lever configurations described above are intended to reduce interference between the levers and I/O connectors, in many cases these configurations restrict I/O connector placement within available module bezel space. The levers may further interfere with cables plugged into those connectors.

SUMMARY

The various embodiments of the present network device and associated methods have several features, no single one of which is solely responsible for their desirable attributes. Without limiting the scope of the present embodiments as expressed by the claims that follow, their more prominent features now will be discussed briefly. After considering this discussion, and particularly after reading the section entitled "Detailed Description of the Preferred Embodiments," one will understand how the features of the present embodiments provide advantages, which include avoidance of interference between the levers and the portion of the bezel area used by I/O connectors and increased lever handle length.

One embodiment of the present network device comprises a module including an enclosure. A chassis supports the module. A lever is secured to the module enclosure by a pivot. A pivot axis of the lever is parallel to a major axis of the module.

Another embodiment of the present network device comprises a first module including an enclosure. The device further comprises a second module including an enclosure. A chassis supports the module. A lever is secured to the first module enclosure by a pivot. The second module enclosure includes a clearance through which a portion of the lever may pass without contacting the second module.

Another embodiment of the present network device comprises a module including an enclosure. A chassis supports the module. A lever is secured to the module enclosure by a pivot. The lever includes a handle portion and a claw portion. A portion of the handle defines a first plane, the claw defines a second plane, and the first and second planes are parallel and spaced from one another.

Another embodiment of the present network device comprises a module including an enclosure. A chassis supports the module. A lever is secured to the module enclosure by a pivot. The lever includes a handle portion and a claw portion. At least part of the claw portion protrudes outward from an envelope of the module enclosure.

BRIEF DESCRIPTION OF THE DRAWINGS

The various embodiments of the present network device and associated methods now will be discussed in detail with an emphasis on highlighting the advantageous features. These embodiments depict the novel and non-obvious network device shown in the accompanying drawings, which are for illustrative purposes only. These drawings include the following figures, in which like numerals indicate like parts.

DETAILED DESCRIPTION

Figure 1:
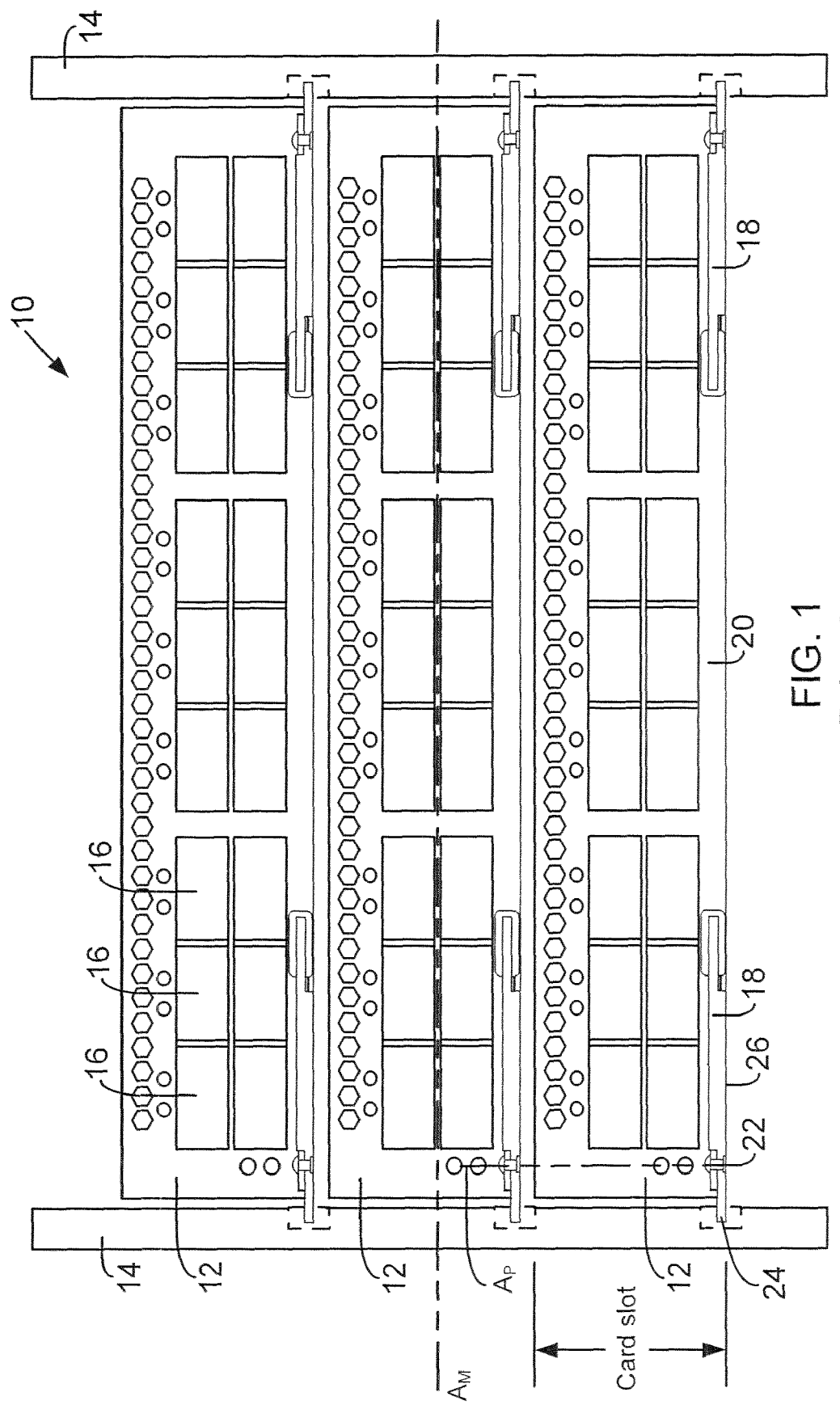
FIG. 1 is a schematic front elevation view of a prior art network device.

The following detailed description describes the present embodiments with reference to the drawings. In the drawings, reference numbers label elements of the present embodiments. These reference numbers are reproduced below in connection with the discussion of the corresponding drawing features. As used herein, the terms horizontal and vertical are used with reference to the orientation of the network devices shown in the drawings where a major axis of each module is substantially horizontal. In practice, however, a network device may have an orientation different from that shown certain embodiments. For example, a major axis of each module may be substantially vertical. Accordingly, the description herein should not be interpreted as limiting the scope of the present embodiments to any particular orientation.

Figure 2:
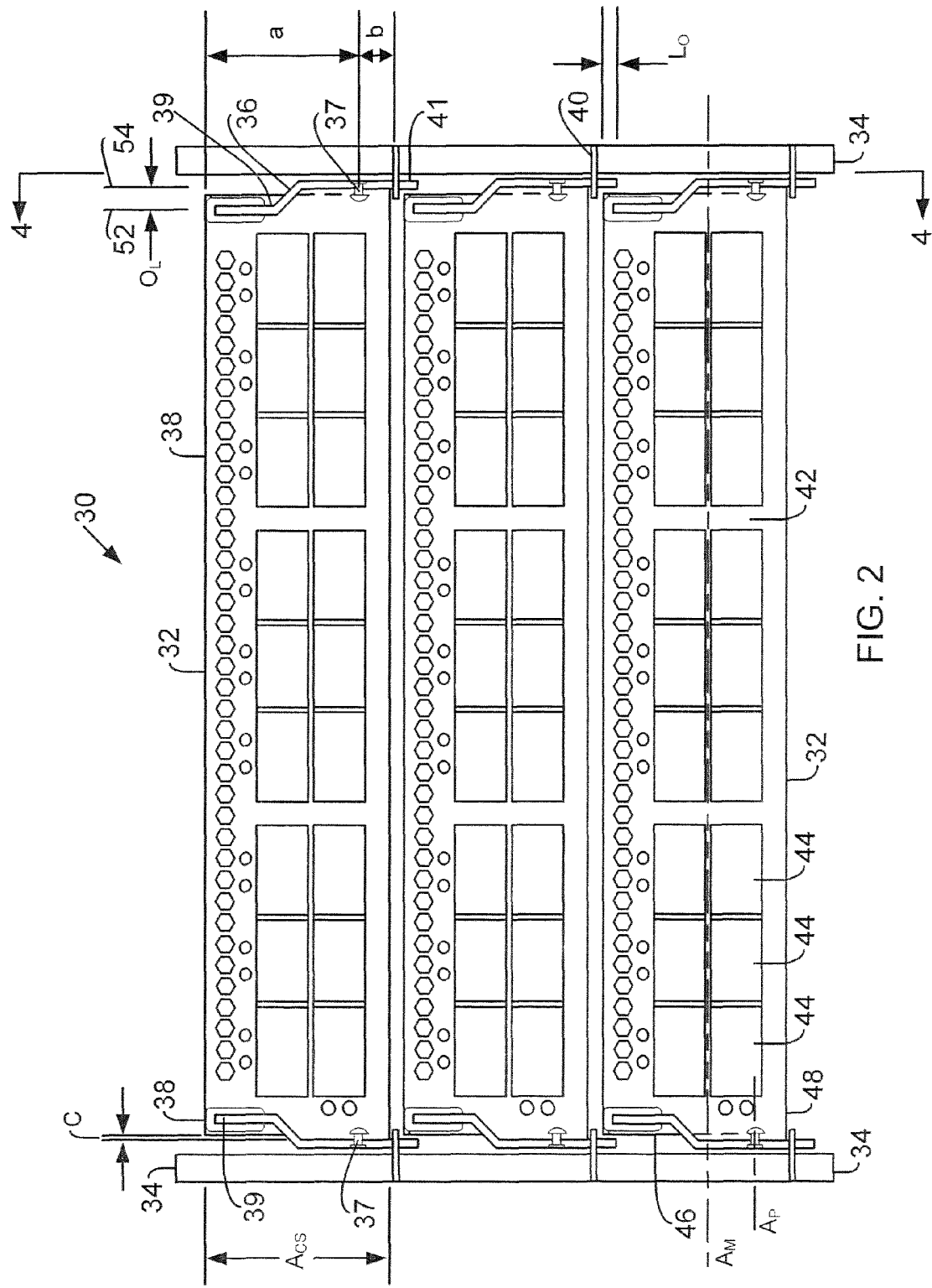
FIG. 2 is a schematic front elevation view of one embodiment of the present network device

FIG. 2 illustrates one embodiment of the present network device 30 having a novel module/lever configuration. In the illustrated embodiment, the network device 30 includes three modules 32 supported by a chassis 34. Those of ordinary skill in the art will appreciate, however, that the present network device 30 is not limited to any particular number or type of modules.

As shown in the upper right of FIG. 2, levers 36 are pivotably secured to either end of each module enclosure 38 by a pivot 37. Each lever 36 includes a handle portion 39 and a claw portion 41. The handle portion 39 and the claw portion 41 are disposed on opposite sides of the pivot 37. The claw portion 41 is configured to engage a feature 40 on the chassis 34. The feature 40 provides a contact point for the lever 36 so that an operator can take advantage of the mechanical advantage created by the lever to completely insert the module 32 into the chassis 34.

Figure 3:
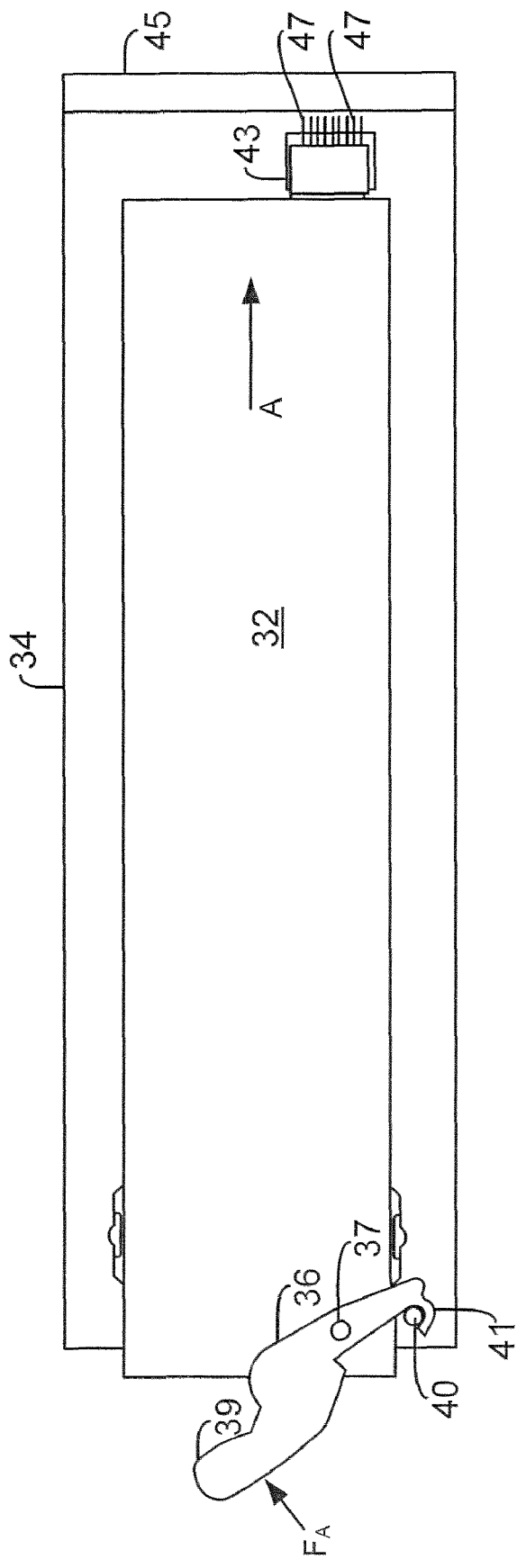
FIG. 3 is a schematic right-side elevation view of one module of the network device of FIG. 2, illustrating the module partially inserted within the chassis.
Figure 3A:
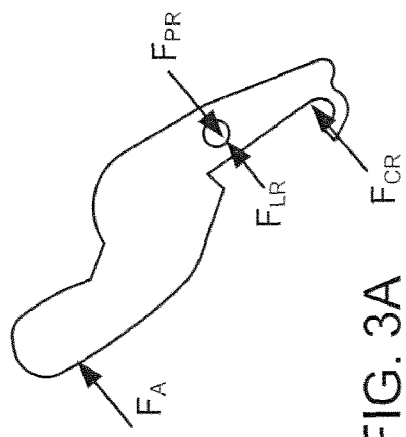
FIG. 3A is a free body diagram of the lever of FIG. 3.
Figure 4:
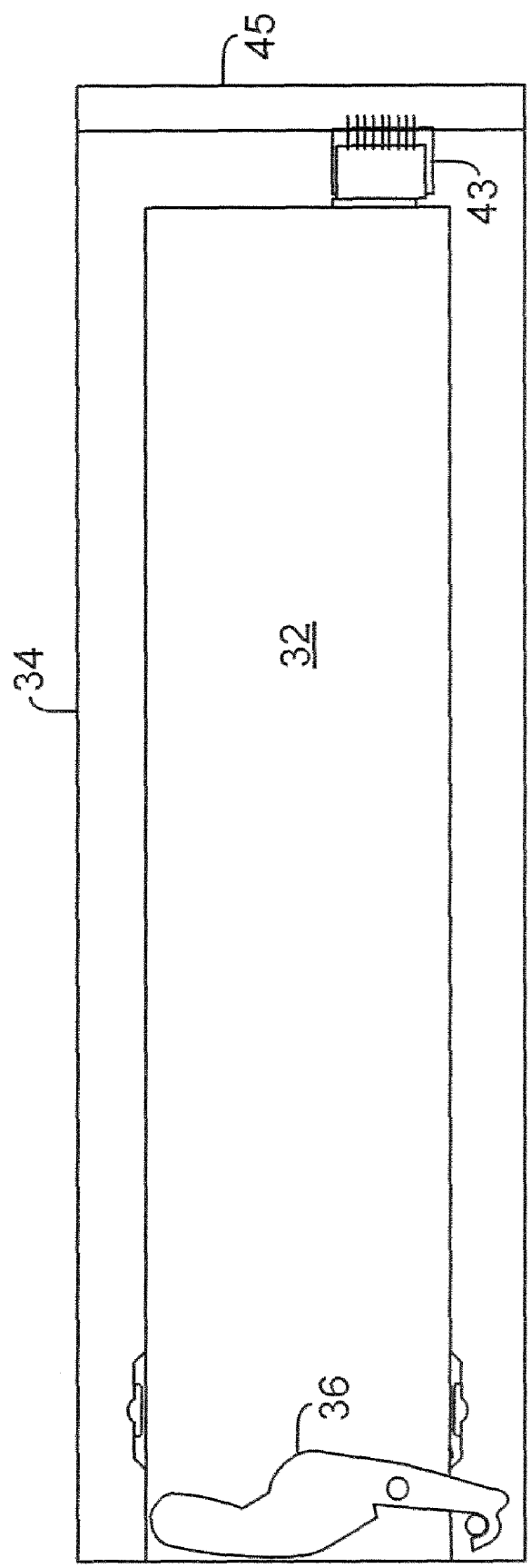
FIG. 4 is a portion of a schematic cross-sectional view of the network device of FIG. 2 taken along the line 4-4 in FIG. 2.

FIGS. 3 and 4 illustrate the process by which an operator inserts a module 32 into the chassis 34. For clarity, only one module 32 is shown in FIGS. 3 and 4. To begin, the operator slides the module 32 into the chassis 34 until a connector 43 on a back side of the module 32 approaches a midplane/backplane 45 of the network device 30, as shown in FIG. 3. As those of ordinary skill in the art understand, the midplane/backplane 45 provides electrical interconnection between the module 32 and other modules 32 in the same device 30 (if present), and between the module 32 and other network devices (not shown). The connectors 45 on the module 32 include male electrical contacts 47 that must be inserted into female electrical contacts (not shown) on the midplane/backplane 45 in order to establish the electrical connection. Friction between the contacts resists the insertion process. Thus, when the module 32 has been inserted into the chassis up to the point just prior to where the male electrical contacts 47 will be inserted into female electrical contacts (FIG. 3), the operator engages the claws 41 of the levers 36 with the features 40 and applies forces $F_A$ to the handles 39 to pivot the levers 36 in a first direction about the pivots 37. The applied forces $F_A$, and reaction forces $F_{PR}$, $F_{CR}$ at the pivots 37 and claws 41, respectively, create a three-point bending load on each lever 36, as shown in FIG. 3A. The applied forces $F_A$ and the claw reaction $F_{CR}$ forces act on the lever 36 in a first direction, and the pivot reaction forces $F_{PR}$ act on the lever 36 in the opposite direction. A reaction force $F_{LR}$ created by the lever 36 acting on the pivot 37 forces the module 32 into the chassis 34 (in the direction of the arrow A in FIG. 3) against the frictional forces of the connectors at the back side of the module 32. As indicated in FIG. 2, the distance between the pivot 37 and the end of the handle portion 39 is a, and the distance between the pivot 37 and the feature 40 is b. a/b provides the mechanical advantage achieved by the lever 36. FIG. 4 illustrates the module 32 completely inserted into the chassis 34 with the connector 43 engaging, the midplane/backplane 45 and the lever 36 stored out of the way on the side of the module 32.

With reference to FIG. 2, in one aspect the pivots 37 are secured to their respective enclosures such that the pivot axis $A_P$ of each lever 36 is parallel to the major axis $A_M$ of the corresponding module 32. In this orientation the length of each lever 36 is oriented to be orthogonal to the major axis $A_M$ of the corresponding module 32. The levers 36 advantageously do not overlap any portion of the bezel area 42 used by I/O connectors 44.

Each lever 36 extends along the short side 46 of its module enclosure 38. Consequently, the length of each lever 36 may be limited, because it is advantageous to prevent the levers 36 from interfering with the ability of adjacent modules 32 to be added to or removed from the chassis 34. To increase the length of the lever handle 39, and thus the mechanical advantage achieved by the lever 36, the present embodiments position the pivot 37 close to the long edge 48 of the enclosure. As a result, the claw 41 of the lever 36 protrudes outside the module's card slot area $A_{CS}$, which in the present embodiments is equal to the module's vertical height. The claw 41 of the lever 36 overlaps the adjacent module's card slot area by a length $L_O$. The lever 36 is thus not fully contained within the space envelope defined by the card slot. As indicated, however, it is advantageous to prevent the levers 36 from interfering with the ability of adjacent modules 32 to be added to or removed from the chassis 34. Accordingly, the present embodiments include features that avoid such interference.

First, the module enclosure 38 includes a clearance C in an area adjacent the chassis 34. The clearance provides a greater horizontal distance between the enclosure 38 and the chassis 34 in the area of the handle 39 as compared to the distance between the enclosure 38 and the chassis 34 in the area of the pivot 37. The claw 41 of each lever 36 can freely move through the clearance without touching the enclosure 38 of the adjacent module 32.

Second, the lever 36 is shaped with an offset $O_L$. The claw 41 of each lever 36 can thus freely move through the module enclosure clearance without touching the handle 39 of the adjacent lever 36. In the illustrated embodiment, the lever offset comprises a portion of the handle 39 defining a first plane 52, and the claw 41 defining a second plane 54. The first and second planes 52, 54 are parallel and spaced from one another. Those of ordinary skill in the art will appreciate that other handle shapes may achieve similar advantages to the shape shown in FIG. 2. For example, the planes defined by the handle portion 39 and the claw portion 41 may be nonparallel and intersecting. Alternatively, substantially all of the handle portion 39 may lie in the same plane as the claw portion 41 with only a small portion of the handle 39 lying at an angle to that plane.

As described above, the present embodiments achieve significant advantages. For example, the levers 36 are also completely outside of the bezel area 42 used for I/O connectors 44. Further, the engage/disengage levers 36 extend along the short sides 46 of the module enclosures 38 and are orthogonal to the major axes $A_M$ of their respective modules 32. The levers 36 thus do not interfere with cabling (not shown) extending out of the I/O connectors 44. The lever claw portion 41 extends beyond the card slot envelope and overlaps the adjacent module card slot. The claw portion 41 can thus be made with a larger volume of material so that it is sturdier. The module enclosure 38 includes a clearance C that enables the claw portion 41 of one lever 36 to avoid contact with the enclosure of the adjacent module 32. Further, the lever 36 includes an offset that enables the handle portion 39 to clear the claw 41 of the adjacent module's lever 36.

The above description presents the best mode contemplated for carrying out the present network device having levers and associated methods, and of the manner and process of making and using it, in such full, clear, concise, and exact terms as to enable any person skilled in the art to which it pertains to make and use this network device. This network device is, however, susceptible to modifications and alternate constructions from that discussed above that are fully equivalent. Consequently, this network device is not limited to the particular embodiments disclosed. On the contrary, this network device covers all modifications and alternate constructions coming within the spirit and scope of the network device as generally expressed by the following claims, which particularly point out and distinctly claim the subject matter of the network device.

What is claimed is:

1. A network device, comprising:
   a first module including an enclosure;
   a second module including an enclosure;
   a chassis supporting the modules; and
   a lever secured to the first module enclosure by a pivot;
   wherein the second module enclosure includes a clearance through which a portion of the lever may pass without contacting the second module; and
   wherein the clearance provides a greater distance between the second module enclosure and the chassis in a handle area of the lever as compared to a distance between the enclosure and the chassis in an area of the pivot.

2. The network device of claim 1, wherein a length of the lever is orthogonal to a major axis of the first module.

3. The network device of claim 1, wherein the lever extends along a short side of the first module enclosure.

4. The network device of claim 1, wherein the pivot is located adjacent a long edge of the first module enclosure.

5. The network device of claim 1, wherein the lever does not overlap any portion of a bezel area used by input/output connectors of the network device.

6. The network device of claim 1, wherein a pivot axis of the lever is parallel to a major axis of the first module.

7. A network device, comprising:
   a module including an enclosure;
   a chassis supporting the module; and
   a lever secured to the module enclosure by a pivot, the lever including a handle portion and a claw portion;
   wherein a portion of the handle defines a first plane, the claw defines a second plane, and the first and second planes are parallel and spaced from one another.

8. The network device of claim 7, wherein the first plane intersects the enclosure.

9. The network device of claim 7, wherein a length of the lever is orthogonal to a major axis of the module.

10. The network device of claim 7, wherein the lever extends along a short side of the module enclosure.

11. The network device of claim 7, wherein the pivot is located adjacent a long edge of the module enclosure.

12. The network device of claim 7, wherein the lever does not overlap any portion of a bezel area used by input/output connectors of the network device.

13. The network device of claim 7,
    wherein at least part of the claw portion protrudes outward from a space envelope defined by a card slot of the chassis.

14. The network device of claim 13, wherein the claw portion extends into a space envelope defined by a second card slot of the chassis.

15. The network device of claim 7, wherein a pivot axis of the lever is parallel to a major axis of the module.

* * * * *